United States Patent
Takeuchi et al.

(10) Patent No.: US 7,197,059 B2
(45) Date of Patent: Mar. 27, 2007

(54) SHORT WAVELENGTH DIODE-PUMPED SOLID-STATE LASER

(75) Inventors: Eric B. Takeuchi, San Diego, CA (US); David E. Hargis, San Diego, CA (US)

(73) Assignee: Melles Griot, Inc., Carlsbad, CA (US)

( * ) Notice: Subject to any disclaimer, the term of this patent is extended or adjusted under 35 U.S.C. 154(b) by 17 days.

(21) Appl. No.: 11/138,606

(22) Filed: May 25, 2005

(65) Prior Publication Data

US 2005/0265411 A1    Dec. 1, 2005

Related U.S. Application Data

(63) Continuation-in-part of application No. 10/434,579, filed on May 8, 2003.

(60) Provisional application No. 60/574,351, filed on May 25, 2004, provisional application No. 60/378,850, filed on May 8, 2002.

(51) Int. Cl.
    *H01S 3/09* (2006.01)
(52) U.S. Cl. .......................................... 372/69; 372/22
(58) Field of Classification Search .................. 372/39, 372/71, 23, 69; 359/341.5; 385/142
    See application file for complete search history.

(56) References Cited

U.S. PATENT DOCUMENTS

| | | | | |
|---|---|---|---|---|
| 3,624,549 A | * | 11/1971 | Geusic et al. | 372/68 |
| 5,022,040 A | * | 6/1991 | Pollack et al. | 372/69 |
| 5,708,672 A | * | 1/1998 | Pessot et al. | 372/23 |
| 5,802,086 A | * | 9/1998 | Hargis et al. | 372/22 |
| 6,614,827 B1 | | 9/2003 | Mooradian | |
| 6,778,582 B1 | | 8/2004 | Mooradian | |
| 2003/0235228 A1 | | 12/2003 | Bacher et al. | |
| 2005/0002433 A1 | | 1/2005 | Mooradian | |

OTHER PUBLICATIONS

Bihari et al., Spectroscopy of LiYF4:Eu3+ single Crystals, J. Phys.: Condens. Matter, vol. 2, pp. 5703-5713 (1990).*
Colak and Zwicker, Transition rates of Tb3+ in TbP5O14, TbLiP4O12, and TbAl3(BO3)4: An evaluation for laser applications, J. Appl. Phys., vol. 54, No. 5, pp. 2156-2166 (1983).*

(Continued)

*Primary Examiner*—Minsun Oh Harvey
*Assistant Examiner*—Toan N. Nguyen
(74) *Attorney, Agent, or Firm*—Knobbe Martens Olson & Bear LLP

(57) ABSTRACT

A diode-pumped solid-state laser including a short wavelength (e.g., blue, violet, or UV) semiconductor laser that pumps an absorption transition in a rare-earth-doped material. Responsive to this pumping, the rare-earth active ion directly emits laser radiation. A number of different wavelength outputs, including short wavelengths, are achievable dependent upon the material and the pump wavelength. The gain medium may include an active ion selected from $Er^{3+}$, $Sm^{3+}$, $Eu^{3+}$, $Tb^{3+}$, $Dy^{3+}$, $Tm^{3+}$, $Ho^{3+}$, and $Pr^{3+}$. A laser diode pump source has a wavelength in the range of about 365 nm to 480 nm to excite a laser emission in the range of 370 to 800 nm. The laser diode pump source may comprise a GaN-based semiconductor. In some embodiments, the laser diode pump source supplies a pump beam in a range of 370–380 nm, 400–415 nm, 435–445 nm, or 468–478 nm.

17 Claims, 13 Drawing Sheets

OTHER PUBLICATIONS

Hsu and Powell, Energy Transfer in Europium doped Yttrium Vanadate Crystals, Journal of Luminescence, vol. 10, pp. 273-293 (1975).*

Richter et al., Diode Pumping of a Continuous-Wave Pr3+—doped LiYF4 Laser, Optics Letters, vol. 29, No. 22, pp. 2638-2640 (Nov. 15, 2004).*

Bihari et al., Spectroscopy of $LiYF_4$:$Eu^{3+}$ single Crystals, J. Phys.: Condens. Matter, vol. 2, pp. 5703-5713 (1990).

Colak and Zwicker, Transition rates of $Tb^{3+}$ in $TbP_5O_{14}$, $TbLiP_4O_{12}$, and $TbAl_3(BO_3)_4$: An evaluation for laser applications, J. Appl. Phys., vol. 54, No. 5, pp. 2156-2166 (1983).

Hsu and Powell, Energy Transfer in Europium Doped Yttrium Vanadate Crystals, Journal of Luminescence, vol. 10, pp. 273-293 (1975).

Richter et al., Diode Pumping of a Continuous-Wave $Pr^{3+}$-doped $LiYF_4$ Laser, Optics Letters, vol. 29, No. 22, pp. 2638-2640 (Nov. 15, 2004).

* cited by examiner

| Initial State | Final State | Initial Energy (cm⁻¹) | Final Energy (cm⁻¹) | Transition Energy (cm⁻¹) | (nm) | Oscillator Strength (10⁻⁶) |
|---|---|---|---|---|---|---|
| $^4S_{3/2}$ | $^4I_{15/2}$ | 18525 | 0 | 18525 | 540 | 1.43 |
| $^2H_{11/2}$ | $^4I_{15/2}$ | 19164.4 | 0 | 19164.4 | 529 | 3.03 |
| $^4F_{7/2}$ | $^4I_{15/2}$ | 20610 | 0 | 20610 | 485 | 2.83 |
| $^4F_{5/2}$ | $^4I_{15/2}$ | 22326.4 | 0 | 22326.4 | 448 | 1.13 |
| $^4F_{3/2}$ | $^4I_{15/2}$ | 22732.4 | 0 | 22732.4 | 440 | 0.93 |
| $^2H_{9/2}$ | $^4I_{15/2}$ | 24691 | 0 | 24691 | 405 | 0.89 |
| $^2H_{9/2}$ | $^4I_{13/2}$ | 24691 | 6687 | 18004 | 556 | 1.56 |
| $^4G_{11/2}$ | $^4I_{15/2}$ | 26400 | 0 | 26400 | 382 | 5.43 |
| $^4G_{11/2}$ | $^4I_{13/2}$ | 26400 | 6687 | 19713 | 507 | 1.55 |
| $^2P_{3/2}$ | $^4I_{13/2}$ | 31600 | 6687 | 24913 | 401 | 1.35 |
| $^2P_{3/2}$ | $^4I_{11/2}$ | 31600 | 10323 | 21277 | 470 | 1.35 |

| Initial State | Final State | Initial Energy (cm$^{-1}$) | Final Energy (cm$^{-1}$) | Transition Energy (cm$^{-1}$) | (nm) | Oscillator Strength (10$^{-6}$) |
|---|---|---|---|---|---|---|
| $^5S_2$ | $^5I_8$ | 18500 | 108 | 18392 | 544 | 4.06 |
| $^5F_4$ | $^5I_8$ | 18608 | 108 | 18500 | 541 | 8.65 |
| $^5F_3$ | $^5I_8$ | 20640 | 108 | 20532 | 487 | 4.95 |
| $^5F_2$ | $^5I_8$ | 21100 | 108 | 20992 | 476 | 3.93 |
| $^5G_6$ | $^5I_8$ | 22100 | 108 | 21992 | 455 | 9.43 |
| $^5G_5$ | $^5I_8$ | 23950 | 108 | 23842 | 419 | 2.29 |

| Initial State | Final State | Initial Energy (cm$^{-1}$) | Final Energy (cm$^{-1}$) | Transition Energy (cm$^{-1}$) | (nm) | Oscillator Strength (10$^{-6}$) |
|---|---|---|---|---|---|---|
| $^3P_0$ | $^3H_4$ | 20860 | 0 | 20860 | 479.4 | 42.9 |
| $^3P_0$ | $^3H_5$ | 20860 | 2610 | 18250 | 547.9 | 9.1 |
| $^1I_6$ | $^3H_4$ | 21443 | 0 | 21443 | 466.3 | .04 |
| $^1I_6$ | $^3H_5$ | 21443 | 2610 | 18833 | 531.0 | 1.3 |
| $^3P_1$ | $^3H_4$ | 21443 | 0 | 21443 | 466.3 | 14.8 |
| $^3P_1$ | $^3H_5$ | 21443 | 2610 | 18833 | 531.0 | 27.7 |
| $^3P_2$ | $^3H_4$ | 22636 | 0 | 22636 | 441.8 | 8.8 |
| $^3P_2$ | $^3H_5$ | 22636 | 2610 | 20026 | 499.4 | 14.9 |

| $Eu^{3+}$:$YVO_4$ Emission Transition ||||
|---|---|---|---|
| Initial State | Final State | Transition ($cm^{-1}$) | (nm) |
| $^5D_0$ | $^7F_2$ | 16145 | 619.4 |
| $^5D_0$ | $^7F_1$ | 16807 | 595.0 |
| $^5D_1$ | $^7F_1$ | 18556 | 539 |
| $^5D_2$ | $^7F_2$ | 20379 | 490.7 |
| $^5D_2$ | $^7F_5$ | 17470 | 572.4 |
| $^5D_0$ | $^7F_3$ | 15318 | 652-655(broad) |

FIG. 13A

| $Eu^{3+}$:$YVO_4$ Emission Transition (Pump Bands) ||||
|---|---|---|---|
| Initial State | Final State | Transition ($cm^{-1}$) | (nm) |
| $^7F_0$ | $^5D_2$ | 21455 | 466 |
| $^7F_1$ | $^5D_2$ | 21085-20983 | 474-477 |
| $^7F_0$ | $^5L_6$ | 25100-25600 | 390.6-398.4 |

FIG. 13B

| Tb³⁺ TAB Emission Transitions | | | |
|---|---|---|---|
| Initial State | Final State | Transition (cm⁻¹) | (nm) |
| $^5D_3$ | $^7F_1$ | 20550 | 486.6 |
| $^5D_3$ | $^7F_2$ | 20950 | 477.3 |
| $^5D_3$ | $^7F_3$ | 21800 | 458.7 |
| $^5D_3$ | $^7F_4$ | 22650 | 441.5 |
| $^5D_3$ | $^7F_5$ | 24050 | 415.8 |
| $^5D_3$ | $^7F_6$ | 26050 | 383.9 |
| $^5D_4$ | $^7F_2$ | 15300 | 653.6 |
| $^5D_4$ | $^7F_3$ | 16150 | 619.2 |
| $^5D_4$ | $^7F_4$ | 16400 | 609.8 |
| $^5D_4$ | $^7F_5$ | 18500 | 540.5 |
| $^5D_4$ | $^7F_6$ | 20600 | 485.4 |

FIG. 14A

| Tb³⁺:TAB Absorption Transitions | | | |
|---|---|---|---|
| Initial State | Final State | Transition (cm⁻¹) | (nm) |
| $^7F_6$ | $^5D_3$ | 26300 | 380 |
| $^7F_6$ | $^5G_6$ | 26450 | 378 |
| $^7F_6$ | $^5L_{10}$ | 27000 | 370 |
| $^7F_6$ | $^5D_4$ | 20650 | 484 |

FIG. 14B

SHORT WAVELENGTH DIODE-PUMPED SOLID-STATE LASER

CROSS-REFERENCE TO RELATED APPLICATION

Priority is hereby claimed to U.S. Provisional Patent Application No. 60/574,351, filed May 25, 2004, entitled Violet Diode-Pumped Solid State Laser, which is incorporated by reference herein in its entirety, and this application is a continuation-in-part of commonly-owned U.S. patent application Ser. No. 10/434,579, filed May 8, 2003, entitled LASER WITH NARROW BANDWIDTH ANTIREFLECTION FILTER FOR FREQUENCY SELECTION, which is incorporated by reference herein in its entirety, which claims the benefit of U.S. Provisional Patent Application No. 60/378,850, filed May 8, 2002.

BACKGROUND OF THE INVENTION

1. Field of the Invention

The invention relates generally to lasers that generate visible or ultraviolet laser light. More specifically, it relates to the field of diode-pumped solid-state lasers (DPSSLs).

2. Description of Related Art

Lasers that generate visible light and ultraviolet radiation have many important uses, such as medical applications, laser light sources for projection displays, and even laser light shows. However, it has proven difficult to design and manufacture lasers that generate light over the entire visible range and into the ultraviolet, for a number of reasons. One reason is that the wavelength of laser emission is determined by the material properties of the gain medium, and therefore the available colors are restricted by these known transitions. For most uses a gain media that emits at discrete transitions, such as Nd:YAG is preferable; however a small number of strong (and therefore useful) energy transitions of the gain medium appear only at a few discrete wavelengths. For example, the strongest $Nd^{3+}$ transitions are in the infrared. Outside of these discrete wavelengths, it can be difficult to obtain and sustain appropriate lasing transitions.

One conventional way of accessing wavelengths that do not lase directly is to convert the laser emission wavelength to a different wavelength, and the process of converting the laser emission to a different wavelength is called "frequency conversion." For example, conventional frequency-converted DPSSLs generate visible laser light utilizing a nonlinear element in the laser cavity to convert the fundamental laser emission (at a "fundamental frequency") to a higher, visible converted frequency. However, the addition of the nonlinear element increases noise and creates instabilities in the output beam, reduces efficiency, and significantly increases the cost of production. Some specific examples of prior art are discussed below.

PRIOR ART EXAMPLE 1

Diode-pumped solid-state lasers with intracavity frequency doubling:

FIG. 1A illustrates a frequency-converted laser. Frequency doubling is one common method for obtaining visible laser emission, and in frequency doubling, the laser utilizes a nonlinear process to convert laser emission at a fundamental wavelength (e.g., near-infrared) into a second harmonic (e.g., in the visible range), resulting in visible laser light output at the doubled frequency. For example, a semiconductor laser diode emitting in the near-infrared spectral region is used to optically pump a triply-ionized rare-earth element that has been doped into a glass or crystalline host material. The rare-earth element first absorbs this pump radiation, and then re-radiates at a longer wavelength (the fundamental laser frequency), which then resonates within the laser cavity. By arranging an appropriate nonlinear crystal within the laser resonator, the fundamental laser radiation is frequency doubled to produce laser radiation in the visible spectrum. Depending upon the specific rare-earth element and the host material into which it is doped, frequency-doubled laser radiation can be generated at a number of wavelengths throughout the entire visible spectrum.

PRIOR ART EXAMPLE 2

Optically-pumped semiconductor laser with intracavity frequency doubling: One prior art method uses a conventional semiconductor laser to optically pump a second semiconductor gain medium, thereby generating fundamental radiation in the near-infrared spectral region. By employing an external cavity geometry (i.e., placing a mirror separate from the gain medium with a high reflectivity at the desired fundamental frequency), a nonlinear crystal can be placed inside the same cavity to achieve second harmonic generation (SHG).

PRIOR ART EXAMPLE 3

Electrically-pumped semiconductor lasers with intracavity frequency doubling. Similar to prior art example 2, but in this example the semiconductor laser is electrically-pumped, and used directly as the laser source that is frequency doubled. This example eliminates the need for a separate semiconductor gain medium.

PRIOR ART EXAMPLE 4

Electrically-pumped semiconductor lasers with extracavity frequency doubling: FIG. 1B is a schematic view of a prior art laser in which the output of a semiconductor laser is used as the input to a external frequency conversion device, such as a periodically-poled nonlinear crystal, which operates in a single pass. Because the nonlinear crystal is placed outside of the laser cavity, this device typically requires a high effective nonlinearity to achieve efficient frequency conversion into the second harmonic. Periodically-poled structures in materials such as $LiNbO_3$, KTP, KN are typically used, although such structures may not be necessary if the bulk nonlinear material properties allow for sufficient second harmonic generation.

PRIOR ART EXAMPLE 5

Intracavity sum-frequency generation: Similar to other intracavity frequency conversion geometries that use semiconductor lasers as a source, the laser beams are generated in a semiconductor, but instead of second harmonic generation from a fundamental frequency, two different laser frequencies (e.g., from two different semiconductor lasers) are then combined within a nonlinear material to generate the visible wavelength desired.

PRIOR ART EXAMPLE 6

Direct emitting semiconductor radiation: Practical visible wavelength semiconductor lasers have been demonstrated suitable only in the red spectral region; however with these red lasers, the spatial and spectral beam quality is not sufficient for many applications. In the short-wavelength (blue) spectral region, low-power lasers based upon the GaN and ZnSe material families have been demonstrated. Similar to the red laser diodes, however, the spatial and spectral beam quality obtained with this technology is not sufficient for many applications. Furthermore, the blue diode lasers are very low power, may not be scalable to higher powers, and therefore are not suitable for many desired applications. Future applications of either of these technologies into the blue-green and green spectral regions may be limited by material parameters.

SUMMARY OF THE INVENTION

A diode-pumped solid-state laser is described herein that includes a short wavelength (e.g., blue, violet, or UV) semiconductor laser to pump an absorption transition in a rare-earth-doped material. Responsive to this pumping, the rare-earth active ion directly emits laser radiation. A number of different wavelength outputs, including short wavelength outputs (e.g., blue), are achievable dependent upon the gain medium and the pump wavelength.

In one embodiment, the diode-pumped, solid-state laser that emits an output beam having a short wavelength comprises a laser cavity including a first and a second end mirror, a gain medium situated within the laser cavity, the gain medium including a rare-earth doped solid state material providing a lasing transition from an upper laser level to a lower laser level. The gain medium may include an active ion selected from $Er^{3+}$ $Sm^{3+}$, $Eu^{3+}$, $Tb^{3+}$, $Dy^{3+}$, $Tm^{3+}$, $Ho^{3+}$, and $Pr^{3+}$.

A laser diode pump source is arranged to pump the gain medium, the laser diode pump source having a wavelength in the range of about 365 nm to 480 nm to excite the rare-earth element to an energy level at least equal to the upper laser level, thereby providing a laser emission from the lasing transition within the laser cavity in the range of 370 to 800 nm. The laser diode pump sources may comprise a GaN-based semiconductor; particularly, the laser diode pump source may comprises one of GaN, AlGaN, and InGaN. In some embodiments, the laser diode pump source emits a beam in the range of 370–380 nm, 400–415 nm, 435–445 nm, or 468–478 nm.

BRIEF DESCRIPTION OF THE DRAWINGS

For a more complete understanding of this invention, reference is now made to the following detailed description of the embodiments as illustrated in the accompanying drawing, wherein:

FIG. 9 illustrates the potential for using a semiconductor laser emitting in the 370–385 nm regime to pump $Tb^{3+}$ active ions, resulting in visible emission;

FIG. 13A is a table of emission transitions of $Eu^{3+}$:$YVO_4$;

FIG. 13B is a table of absorption transitions of $Eu^{3+}$:$YVO_4$;

FIG. 14A is a table of emission transitions of $Tb^{3+}$:TAB; and

FIG. 14B is a table of absorption transitions of $TB^{3+}$:TAB.

DETAILED DESCRIPTION

This invention is described in the following description with reference to the Figures, in which like numbers represent the same or similar elements.

Glossary of Terms and Acronyms

The following terms and acronyms are used throughout the detailed description. For convenience, some of the two-letter representations for elements are included in following; any omitted elements are readily available on any periodic chart of the elements.

| | |
|---|---|
| AR coating | anti-reflective coating |
| Ce | cerium |
| cw | substantially continuous wave (non-pulsed) laser operation |
| DPSSL | diode-pumped solid state laser |
| Dy | dysprosium |
| Er | erbium |
| Eu | europium |
| finesse of etalon | ratio of the separation of adjacent transmission maxima to the FWHM |
| FSR | free spectral range (≈c/2 nL) |
| FWHM | full width half maximum |
| Gd | gadolinium |
| Ho | holmium |
| LBO | lithium triborate (a nonlinear material) (n = 1.61 @860 nm) |

-continued

| | |
|---|---|
| n | index of refraction, which is a characteristic of the optical properties of a material |
| Nd | neodymium |
| Pm | promethium |
| Pr | praseodymium |
| SHG | second harmonic generation: a process by which the laser emission frequency is doubled |
| Sm | samarium |
| Tb | terbium |
| Tm | thulium |
| uv | ultraviolet radiation: wavelengths below about 400 nm to about 1 nm |
| visible region | light with wavelengths of approximately 400 nm to 750 nm |
| wavelength | a characteristic of electromagnetic radiation that, in the visible region, defines its color. |
| YAG | yttrium aluminum garnet |
| Yb | ytterbium |

Herein, the terms "wavelength" ($\lambda$) and "frequency" (f) are used interchangeably to characterize one parameter of laser radiation. Wavelength is defined herein as the wavelength in free space, and therefore either term (i.e., either wavelength or frequency) uniquely characterizes the laser radiation in accordance with the relationship $\lambda f=c$, where c equals the speed of light in the medium (herein assumed to be free space).

Overview

The diode-pumped solid-state laser described herein uses the output of a short wavelength (e.g., blue, violet, or UV) semiconductor laser to pump an absorption transition in a rare-earth-doped material arranged within a laser cavity. Responsive to this pumping, the active rare-earth element emits in the visible region of the spectrum. For purposes herein, the visible region is defined as an emission approximately within a range from about 400 to 750 nm.

Laser Description

Figure 1A:
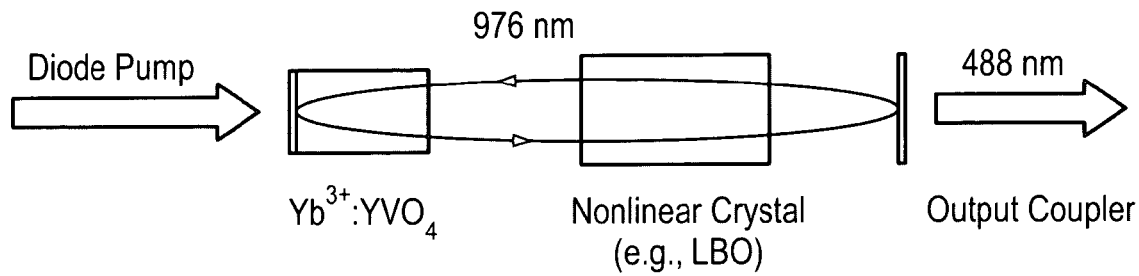
FIG. 1A is a schematic view of a prior art intracavity frequency-converted DPSSL.
Figure 1B:
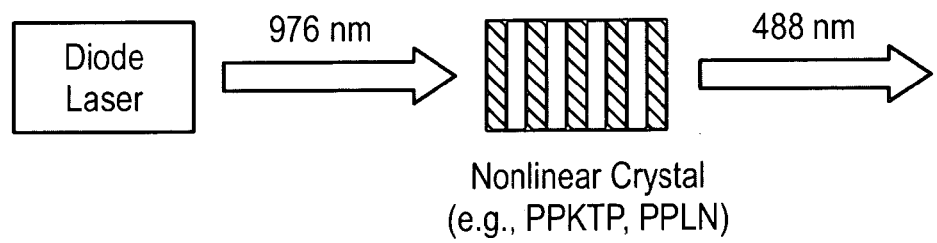
FIG. 1B is a schematic view of a prior art diode laser that is frequency-converted in a periodically poled nonlinear material situated external from the cavity.
Figure 2:
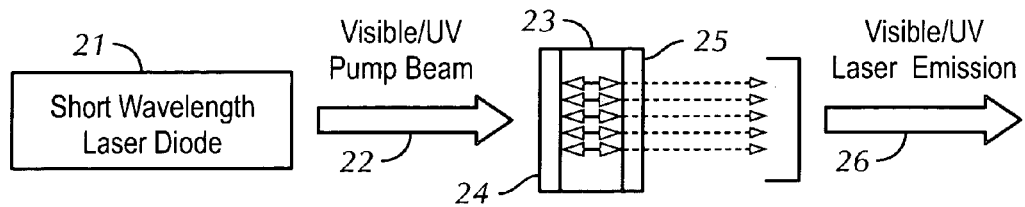
FIG. 2 is a schematic view of a monolithic embodiment of a DPSSL.
Figure 3:
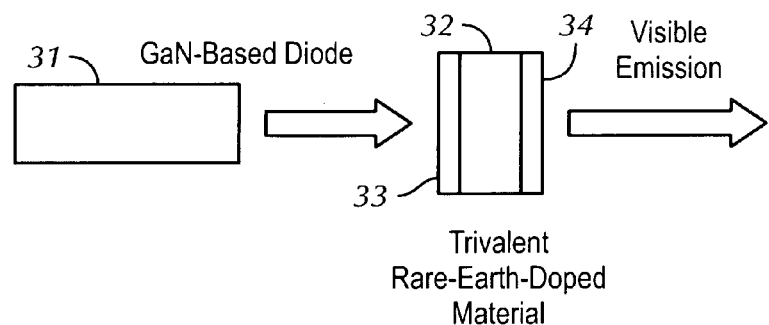
FIG. 3 is a perspective view of one particular monolithic embodiment of DPSSL.
Figure 4A:
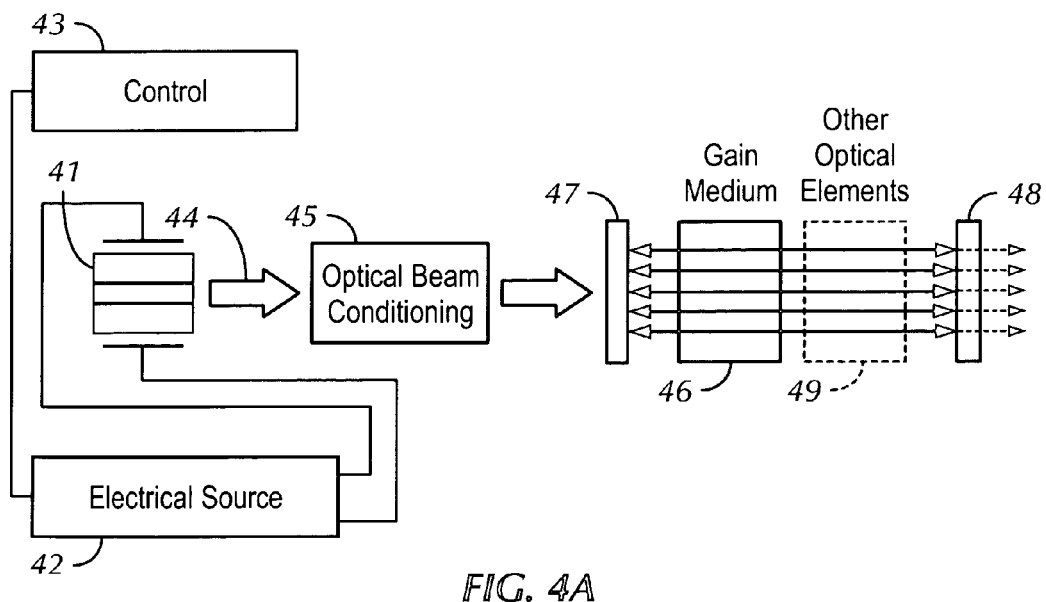
FIG. 4A is a schematic view of an embodiment of a DPSSL in which the end mirrors are situated externally from the outside surface of the gain medium.

Reference is now made to FIGS. 2, 3, and 4A. FIG. 2 is a schematic view of a monolithic embodiment of a DPSSL, FIG. 3 is a perspective view of one monolithic embodiment of DPSSL, and FIG. 4A is a schematic view of an embodiment of a DPSSL in which the end mirrors are situated externally from the outside surface of the gain medium. It should be apparent that the DPSSL can be made in a variety of configurations in addition to those shown; for example a different cavity configuration (e.g., a ring cavity) may be used.

In FIG. 2, a semiconductor laser 21 (i.e., a laser diode) is provided that emits a laser beam 22 in the short wavelength (blue/violet/UV) spectral region. For example the GaN/AlGaN/InGaN family of materials that are used for semiconductor lasers can provide compositionally-tuned direct bandgap energies corresponding to stimulated emission from the ultraviolet (UV) through the blue-green spectral regions. Semiconductor lasers are now commercially available for example in the 365–480 nm regime, for example from 370–380 nm, 400–415 nm, 435–445 nm, and 468–478 nm.

The visible optical pump source includes a single laser diode (such as shown at 41 in FIG. 4A) or an array of laser diodes to optically pump the gain medium with pump radiation. As shown in FIG. 4A, the pump source additionally includes an electrical source 42 and a control system 43 connected to the laser diode. The control system may possibly be connected to other sensors, such as a beam sensor and/or a temperature sensor. Additionally, the pump source may include a heat sink or other temperature regulation means to maintain proper laser operation.

In the monolithic configurations shown in FIGS. 2 and 3, a solid state gain medium 23 (which comprises a rare-earth doped laser material, described in detail elsewhere herein) has end reflectors 24 and 25 that define the optical cavity coated directly onto the outer surfaces of the solid state gain medium. In alternative embodiments, one or both end reflectors may be separate mirrors spaced apart from the gain medium (such as the two separate end reflectors shown in FIG. 4A).

FIG. 3 is a perspective view of one embodiment of a monolithic laser including a GaN-based diode 31 that provides a pump beam for a trivalent rare-earth doped laser crystal 32 to provide visible laser emission. The laser mirrors 33 and 34 that define the optical cavity are coated directly on the crystal to provide the visible emission 26.

In operation, the gain medium 23, 32, and 46 (FIG. 4A) is situated within the optical cavity so that it receives pump energy from the pump source, and responsive thereto provides a fundamental laser emission at the first wavelength ($\lambda_f$), generating lasing oscillation within the optical cavity. The lasing oscillation within the optical cavity is illustrated in FIG. 2 by a number of two-sided arrows. In FIG. 2, the pump beam 22 is configured to end-pump the gain medium, which provides visible/UV laser emission 26.

Any suitable pumping arrangement can be implemented; for example, the pumping arrangement may be configured as end pumping, side pumping, or another suitable pumping arrangement. In an end pumping configuration such as shown in FIG. 4A, the pump radiation 44 from the laser diode 41 is conditioned by an optical beam conditioning system 45 (e.g., a relay lens), and then directed as appropriate (e.g., with lenses, mirrors and so forth) to a gain medium 46.

In FIG. 4A, the gain medium, which may be a trivalent lanthanide, or rare-earth element (discussed in more detail elsewhere herein) is arranged between two reflective end mirrors including a first (back) reflector 47 and second (front) reflector 48 that define an optical cavity. The optical cavity defines an optical axis extending from and through the rear reflector and the front reflector. Other optical elements 49 may be situated in the optical cavity; e.g., one or more etalons, non-linear elements, Brewster's windows are provided as appropriate.

In these laser configurations, both the first and second reflectors are reflective at a lasing wavelength $\lambda_f$; specifically, the first reflector is nearly 100% reflective (as reflective as possible at the lasing wavelength), while the second mirror is only partially reflective (e.g., 90–95%) in order to allow the leakage that provides the laser output. In the end-pumped configuration, the first mirror must be substantially transmissive at the wavelength of the pump beam in order to allow the pump beam to propagate through the mirror and to the gain medium with minimal loss; however in alternative embodiments in which the laser is not pumped through the back reflector, then this transmissivity would not be necessary.

Figure 4B:
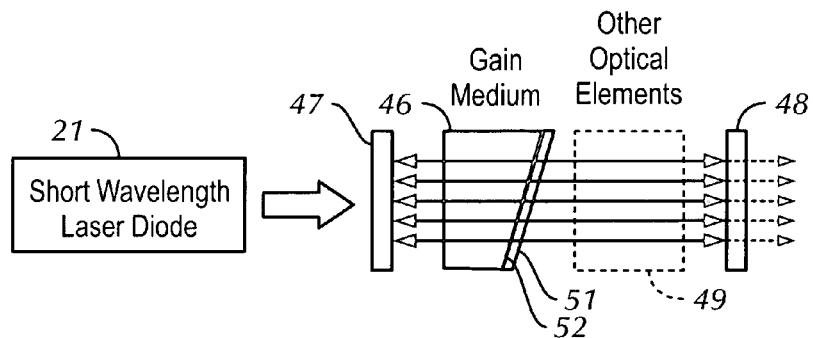
FIG. 4B is a schematic view of an embodiment of a DPSSL that includes a narrowband AR coating on the angled surface in order to select a particular wavelength.

Reference is now made to FIG. 4B. In some embodiments it may be useful to utilize a narrowband anti-reflective (AR) coating such described in co-pending U.S. patent application Ser. No. 10/434,579, filed May 8, 2003, entitled LASER WITH NARROW BANDWIDTH ANTIREFLECTION FILTER FOR FREQUENCY SELECTION, Publication No. US-2003-0235228-A1, which is incorporated by reference herein in its entirety. In the embodiment shown in FIG. 4B, the gain medium 46 includes a narrow-band AR coating 51, which selects the lasing wavelength of the optical cavity. The AR coating 51 is formed on a angled surface 52 of the gain medium; particularly, the angled surface 52 is angled with respect to the optical axis of the laser cavity, and the AR coating has a narrowband coating. One definition of narrowband AR coating in application Ser. No. 10/434,579 is one that has a minimum loss point of less than 2% within the gain-bandwidth of the gain medium, the AR coating limiting the bandwidth of the laser emission to a predetermined spectral range around the minimum loss point. The FWHM bandwidth may be less than about 1 nm, 0.5 nm, or 0.25 nm. The AR coating, in conjunction with all other cavity losses, may constrain the laser emission to a FWHM bandwidth less than about 2 nm. The AR coating may have a minimum loss point of less than about 1%, 0.5%, 0.2%, or 0.1%. Additionally an etalon may be provided in the optical cavity, as one of the additional elements 49.

The AR coating 51 may be formed on an optical element other than the gain medium; for example the narrow-band AR coating may be formed on any angled surface within the optical cavity defined between the front and back mirrors 47 and 48. For example, the AR coating may be formed on an additional intracavity optical element (e.g., a piece of optical glass or a nonlinear element).

Figure 4C:
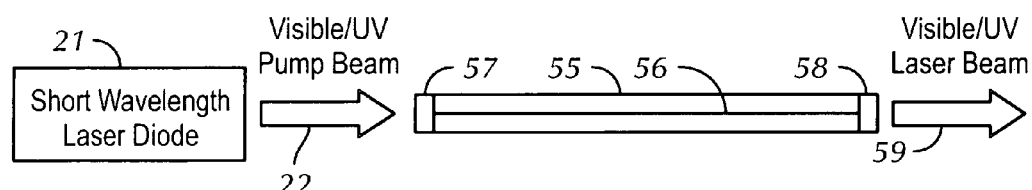
FIG. 4C is a schematic view of a rare-earth-doped fiber laser embodiment.

FIG. 4C is a schematic view of an example of a rare-earth-doped fiber laser pumped by a short wavelength laser diode as described herein. The doped-fiber laser includes an optical fiber 55 having a core 56 doped with a rare-earth lasant ion, such as any $Pr^{3+}$ or any of the other rare-earth lasant ions described herein. At either end of the fiber, a back mirror 57 and a front mirror 57 define an optical cavity for laser emission within the fiber. The back and front mirrors may be coated directly on the ends of the optical fiber 55, or one or both may be external optical elements. The visible/UV pump beam 22 excites laser action within the optical fiber 55, and the visible/UV laser beam 59 exits from the output end of the doped-fiber laser. Advantageously, the optical fiber may be made of silica fibers, which are more durable and less expensive than optical fibers made of ZBLAN or other low phonon energy fibers that have been used in other short wavelength doped-fiber lasers.

Figure 4D:
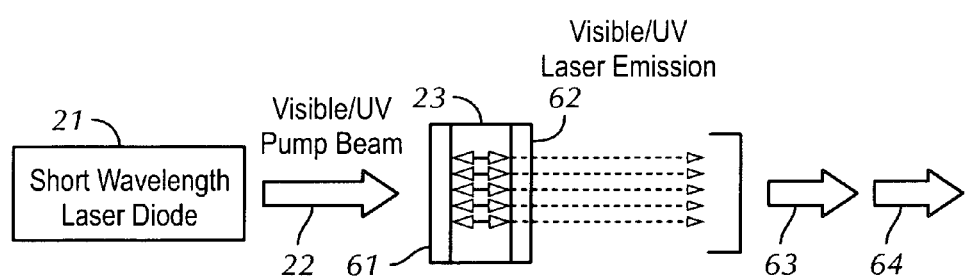
FIG. 4D is a schematic view of a multi-wavelength DPSSL embodiment.

FIG. 4D is a schematic view of a multiple wavelength laser. In FIG. 4D the gain medium 23 includes a back mirror 61 and a front mirror 62 that are coated to be substantially reflective at two or more wavelengths, as described in U.S. Pat. No. 5,708,672, issued Jan. 13, 1998, which is incorporated by reference herein in its entirety. Generally, the peaks of the reflective coatings of the mirrors are selected to match the desired emission peaks of the gain medium. The resulting laser output includes two wavelengths, as shown by a first wavelength laser output 63 and a second wavelength laser output 64.

Figure 4E:
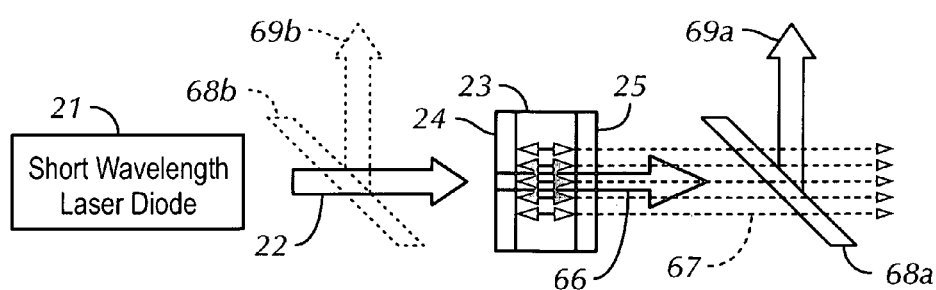
FIG. 4E is a schematic view of an embodiment of a DPSSL in which the residual pump beam is separated from the direct laser emission, to provide two separate beams with different wavelengths.

FIG. 4E is a schematic view of a dual wavelength laser in which the laser radiation from the unabsorbed pump beam is separated from the main laser beam and utilized as desired. In FIG. 4E, the pump beam 22 has sufficient energy that a significant fraction of the energy is unabsorbed in the gain medium 23. Accordingly, a portion of the pump beam, shown at 66, exits with the direct laser emission 67. A dichroic beamsplitter 68a separates the beam into the two different wavelengths, to provide a residual pump beam 69a propagating at an angle with respect to the direct laser emission 67. For example, a 405 nm pump beam can generate a 556 nm laser emission in a $Er^{3+}$ doped gain medium. The direct laser emission at 556 nm exits from the dichroic beamsplitter at a first angle, and the residual pump beam at 405 nm exits from the dichroic beamsplitter at a second different angle. Each beam can then be used as desired. In an alternative embodiment, illustrated in dashed lines in FIG. 4E, a beamsplitter 68b is arranged between the pump source and the laser cavity, so a residual pump beam 69b exits from the laser apparatus. The remainder of the pump beam then continues into the laser cavity to excite laser emission.

Gain Medium Description

Thus, in operation, the visible/UV laser diode pumps a trivalent (triply-ionized) lanthanide, (rare-earth) element doped into a glass or crystalline laser host. The rare-earth element then re-radiates laser radiation directly at a fundamental wavelength that lies in the visible spectral region. For example, a blue-green laser output is one particularly useful emission from a rare-earth doped host.

Several of the trivalent lanthanides, or rare-earth elements, have energy band structures that would allow for optical absorption in the spectral output region from these semiconductor lasers. For example, triply-ionized samarium ($Sm^{3+}$), europium ($Eu^{3+}$), terbium ($Tb^{3+}$), dysprosium ($Dy^{3+}$), holmium ($Ho^{3+}$), erbium ($Er^{3+}$), praseodymium ($Pr^{3+}$), and thulium ($Tm^{3+}$) can all be excited by direct optical absorption in the blue/violet. These same rare-earth elements also operate as the active ion, that is, they can provide laser emission from these excited states to lower-lying energy states, resulting in visible wavelength emission.

Figure 5:
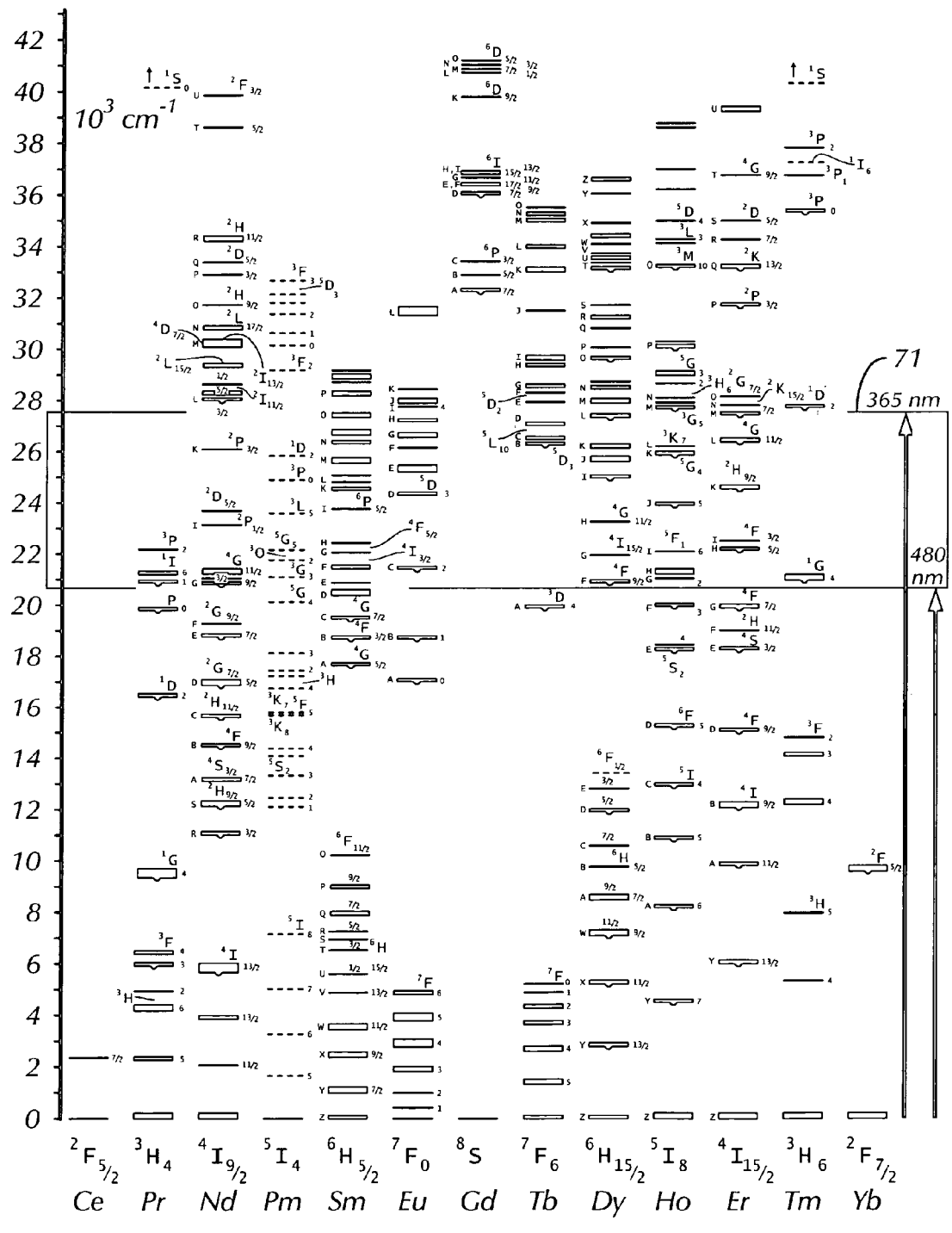
FIG. 5 is a Dieke chart of rare-earth elements, illustrating pump bands in the region between the up-arrows that corresponding to 365 nm and 480 nm pump wavelengths.

FIG. 5 illustrates the free energy levels of the trivalent lanthanides. Particularly, FIG. 5 is a Dieke chart of that shows transitions of rare-earth elements; Pump (absorption) bands are shown in the region of a box 71, defined by the energy levels between the with up-arrows corresponding to 365 nm and 480 nm wavelengths. In other words, any transition within this region may function as an absorption transition. The possible emission transitions include any downward transitions from this region 71, as allowed by quantum rules. Some of these transitions are specified elsewhere herein.

Several of the elements shown in FIG. 5 possess energy levels corresponding to absorption and emission in the wavelength regimes mentioned previously; for example several lasing transitions are discussed below for the active ions praseodymium ($Pr^{3+}$), neodymium ($Nd^{3+}$), samarium ($Sm^{3+}$), europium ($Eu^{3+}$), terbium ($Tb^{3+}$), dysprosium ($Dy^{3+}$), erbium ($Er^{3+}$) and thulium ($Tm^{3+}$); it should be apparent that more transitions for each are possible.

These rare-earth ions provide the lasing transition. To provide a gain medium for a laser cavity, the lasant ion is doped in a suitable concentration into a suitable host material. Some common host materials include $YVO_4$, $GdVO_4$, YAG, YLF, KYF, BYF, FAP, S-FAP, YOS, YSO, YALO, phosphate glass, silica glass, and ZBLAN.

Figure 6:
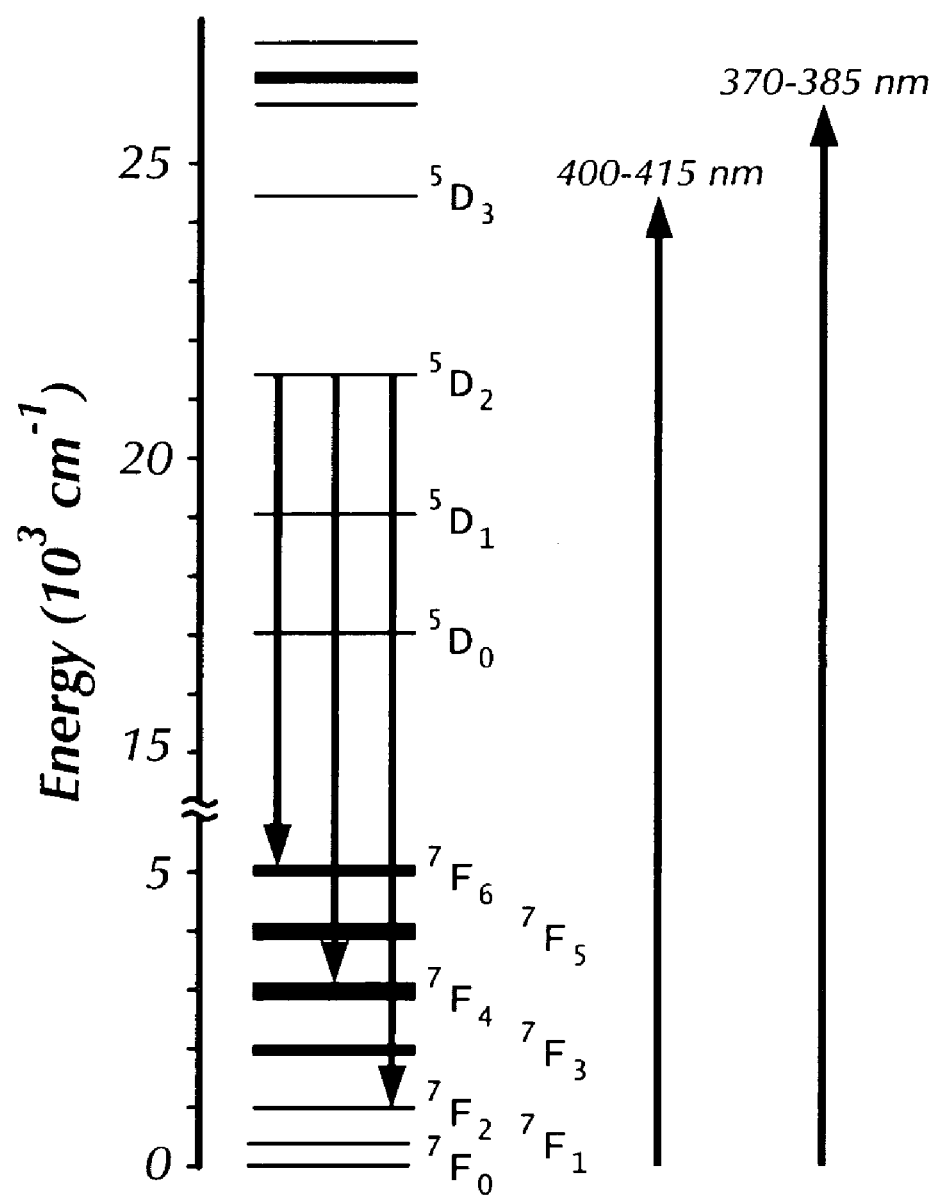
FIG. 6 is a free energy level diagram for triply-ionized europium ($Eu^{3+}$) in a low phonon energy host.

FIG. 6, which is a free-energy level diagram for triply-ionized europium ($Eu^{3+}$) in a low energy host, like a liquid (the vertical axis shows energy in units of $10^3$ $cm^{-1}$). In one specific example a DPSS laser would achieve lasing action at about 488 nm, so as to provide a solid-state replacement for the argon-ion laser emitting around the same wavelength. As disclosed herein, a short wavelength semiconductor laser emitting in the violet spectral region around 375 nm could be used to pump a $Eu^{3+}$ gain medium within the laser cavity. The active dopant could absorb the pump radiation, and re-emit at about 488 nm for example, which is the transition shown on the right. Other visible wavelength transitions are also possible, such as illustrated in FIG. 6.

As known in the art, the specific placement and splitting of the energy levels will be strongly dependent upon the specific host in which the ion is placed. For example, in a specific example of $Eu^{3+}:YVO_4$, emission from the $^5D_0$ level located at about 17,184 cm$^{-1}$ to the $^7F_2$ level located at about 1,039 cm$^{-1}$ results in emission in the red at about 619 nm (corresponding energy of the transition is about 16,145 cm$^{-1}$).

However, the resonant absorption from the $^7F_0$ (ground state) to the $^5D_3$ energy level that would correspond to ~408-nm diode laser radiation is not allowed by quantum rules. Although this is true for most materials, the result is different for $Eu^{3+}:YVO_4$. Particularly, it is believed that, in a $Eu^{3+}:YVO_4$ material system, host-sensitized energy transfer of violet/UV radiation leads to population in the $^5D_N$ levels, where N is 0, 1, 2, 3, . . . Therefore in the host $YVO_4$, the active ion $Eu^{3+}$ can be directly pumped by 408 nm laser diodes.

Figure 7:
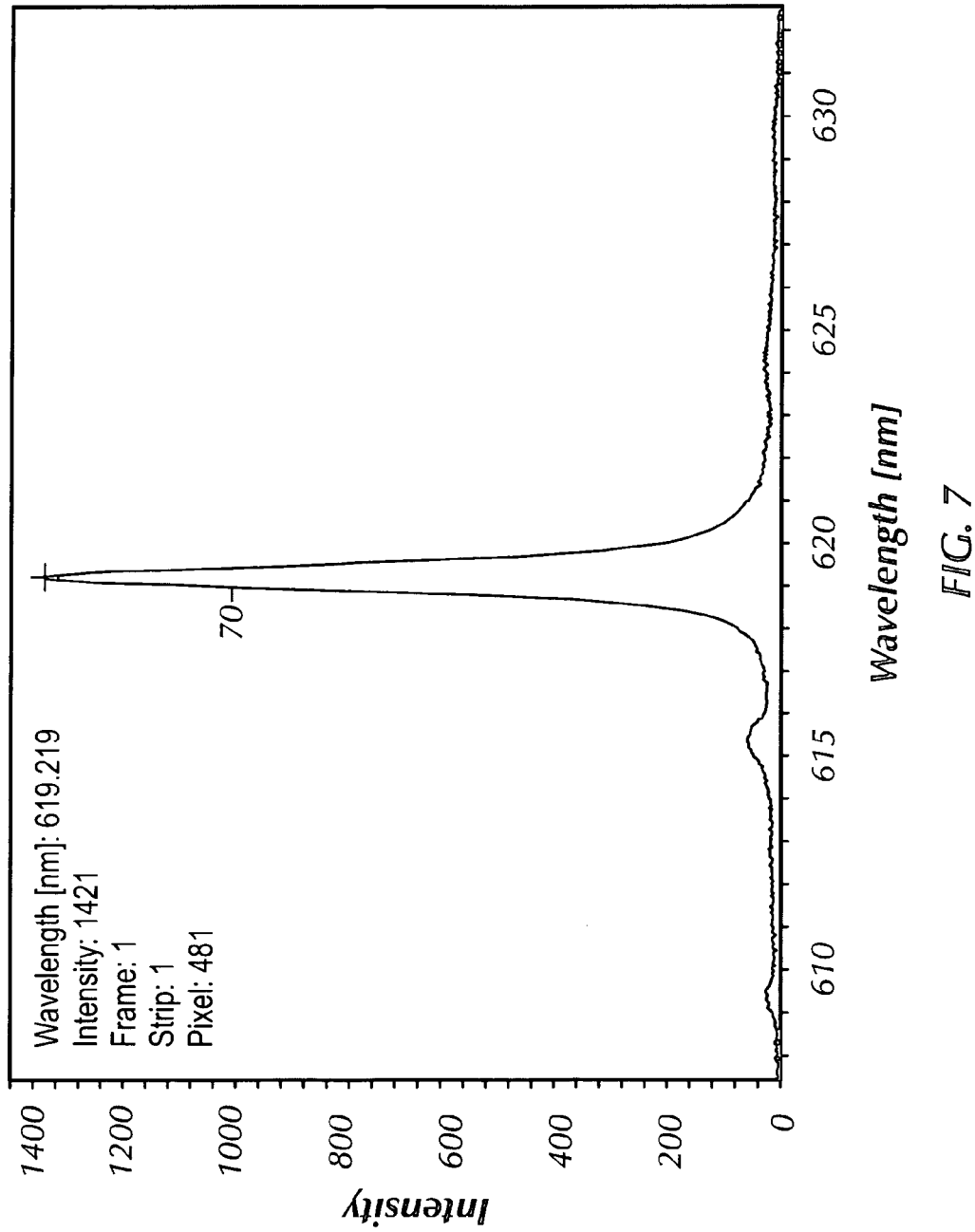
FIG. 7 is a graph of the emission from the $^5D_0$ level to the $^7F_2$ level in $Eu^{3+}$:$YVO_4$, pumped by a violet laser diode.

FIG. 7 is a graph that plots the intensity of the emission from the $^5D_0$ level to the $^7F_2$ level in $Eu^{3+}:YVO_4$, pumped by violet laser diode, as a function of wavelength. Particularly, plot 70 in FIG. 7 shows fluorescence data from this transition from $Eu^{3+}:YVO_4$ pumped with a violet laser diode.

Figure 8:
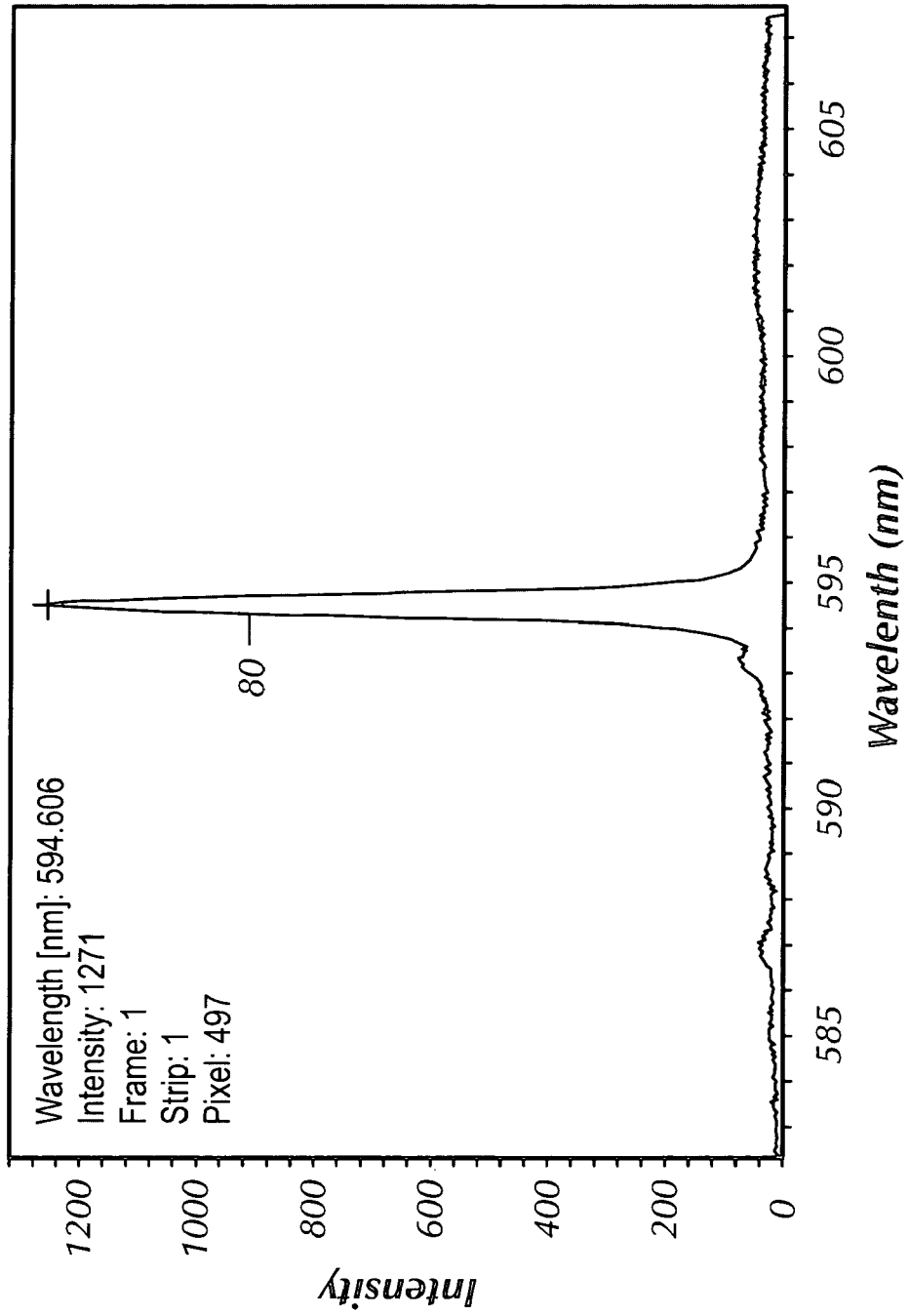
FIG. 8 is a graph of the emission from the $^5D_0$ level to the $^7F_1$ level in $Eu^{3+}$:$YVO_4$, pumped by a violet laser diode.

FIG. 8 is a graph that plots the emission from the $^5D_0$ level to the $^7F_1$ level in $Eu^{3+}:YVO_4$, pumped by a violet laser diode, as a function of wavelength. A plot 80 shows the example emission from the $^5D_0$ level located at about 17,184 cm$^{-1}$ to the $^7F_1$ level located at about 335 cm$^{-1}$ resulting in emission at about 594 nm (corresponding energy of the transition is about 16,849 cm$^{-1}$).

Figure 9:
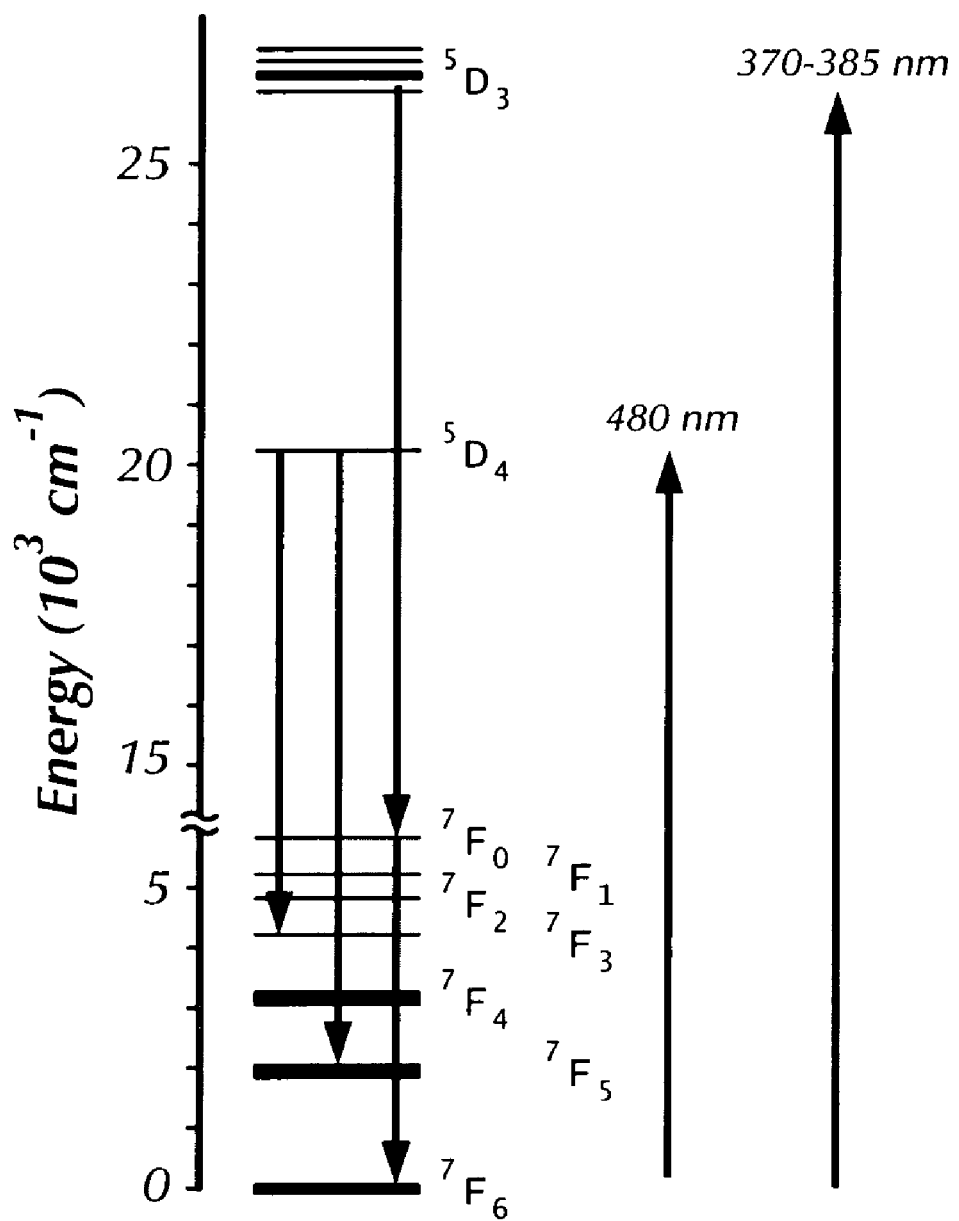
FIG. 9 is a free energy level diagram for triply-ionized terbium ($Tb^{3+}$)

FIG. 9 is a free energy level diagram for triply-ionized terbium ($Tb^{3+}$). The vertical axis shows energy in units of $10^3$ cm$^{-1}$. FIG. 9 illustrates the potential for using a semiconductor laser emitting in the 370–385 nm regime to pump the $Tb^{3+}$ active ions, resulting in emission at about 488 nm. The about 488 nm emission is the transition on the right-most side; shown with two parts. These correspond to two possible transitions, both of which are pumped from the 370–385 nm band. The first transition has its upper laser level originate from the $^5D_3$ level, and its lower laser level originates at $^7F_0$. This would lead to four-level laser operation; which would be more efficient than a three-level configuration.

The second transition results from phonon decay from the pump level [$^5D_3$] to the $^5D_4$ level. The $^5D_4$ level would then be the upper laser level, with the transition terminating on the $^7F_6$ lower laser level. Other visible wavelength transitions may also be possible.

Following are some of the transitions (energy levels) that can generate lasing action as described herein, by active ion and approximate energy level for each transition, noting that it is approximated based upon the free energy diagram; it should be apparent that the exact energy in any particular embodiment would depend heavily upon the specific host. Of course, all of these transitions are subject to the quantum selection rules, and some may not be useful. Particularly, some transitions between energy levels are not allowed based upon quantum electronics selection rules. Also, the specific wavelengths generated by each transition depend upon the host material into which each rare-earth element is doped, and therefore may vary between embodiments. In general the sets of wavelengths that can be generated by each ion vary dependent upon a number of factors, including at least the host material.

The transitions are shown in these energy units in customary fashion; it should be clear that the wavelength corresponding to a given transition is just the inverse of the difference in energy; e.g., for Eu, the $^5D_2 \rightarrow ^7F_2$ transition goes from about 21,500 cm$^{-1}$ to about 1,000 cm$^{-1}$, which is a difference of about 20,500 cm$^{-1}$. To convert to terms of wavelength, the inverse is calculated; for example the inverse of about 20,500 cm$^{-1}$ is about 488 nm.

Samarium (Sm): beginning at upper laser level: $^4G_{5/2}$, the terminal laser levels, and approximate transition energy from the upper laser level are as follows: $^6H_{5/2}$ (~17,550 cm$^{-1}$) (570 nm), $^6H_{7/2}$(~16,550 cm$^{-1}$) (604 nm), $^6H_{9/2}$(about 15,550 cm$^{-1}$) (643 nm), and $^6H_{11/2}$(~14,250 cm$^{-1}$) (702 nm).

Europium (Eu): the upper laser levels, and approximate transition energy from the respective upper laser levels to the terminal laser levels are as follows: from the upper levels $^5D_3$ (~19,000–24,000 cm$^{-1}$) (526–417 nm), $^5D_2$ (~16,500–21,500 cm$^{-1}$) (606–465 nm), $^5D_1$ (~14,000–19,000 cm$^{-1}$) (714–526 nm), and $^5D_0$ (~12,000–17,000 cm$^{-1}$) (833–588 nm), to the terminal laser levels $^7F_i$, i=0 . . . 6.

Terbium (Tb): The upper laser level, and approximate transition energy from the respective upper laser levels to the terminal laser levels is as follows: from the upper laser levels $^5D_3$ (~20,500–26,000 cm$^{-1}$) (488–387 nm), and $^5D_4$ (~15,000–20,500 cm$^{-1}$) (667–488 nm) to the terminal laser levels $^7F_i$, i=0 . . . 6.

Dysprosium (Dy): from the upper laser level: $^4F_{9/2}$, the terminal laser levels, followed by the approximate transition energy from the specified upper laser level are as follows: $^6H_{11/2}$ (~15,250 cm$^{-1}$) (657 nm), $^6H_{13/2}$ (~17,750 cm$^{-1}$) (563 nm), and $^6H_{15/2}$ (about 21,000 cm$^{-1}$) (476 nm).

Thulium (Tm): from the upper laser level: $^1G_4$, the terminal laser level, and the approximate transition energy from the specified upper laser level is as follows: $^3H_6$ (~21,000 cm$^{-1}$) (476 nm).

Following are examples of some transitions that may be of particular interest.

EXAMPLE 1

$Eu^{3+}$:YLF The $^5D_2$-$^7F_3$ transition in YLF leads to emission in the 510 nm regime. Also, the $^5D_2$-$^7F_1$ transition leads to emission in the 470 nm regime.

EXAMPLE 2

$Eu^{3+}$:$YVO_4$: Transitions originating from the $^5D_0$ level lead to visible emission in the red spectral region. The strongest emission appears to be from the $^5D_0$ to the $^7F_2$ level, corresponding to about 619 nm, and the 595 nm transition from the $^5D_0$ to the $^7F_1$ level, and the 539 transition from the $^5D_1$ to the $^7F_1$ level. See FIGS. 13A and 13B for a more detailed description of the emission and pump transitions for $Eu^{3+}$:$YVO_4$.

EXAMPLE 3

$Tb^{3+}$:TAB: Emission from the 5D4 level to the 7F6 level corresponding to emission around 485 nm has been observed. Emission from the 5D4 to the 7F5 level (~541 nm) and to the 7F3 level (~621 nm) is also of interest. See FIGS. 14A and 14B for a more detailed description of the emission and pump transitions for $Tb^{3+}$:TAB.

ADDITIONAL EXAMPLES

Figures 10A, 10B:
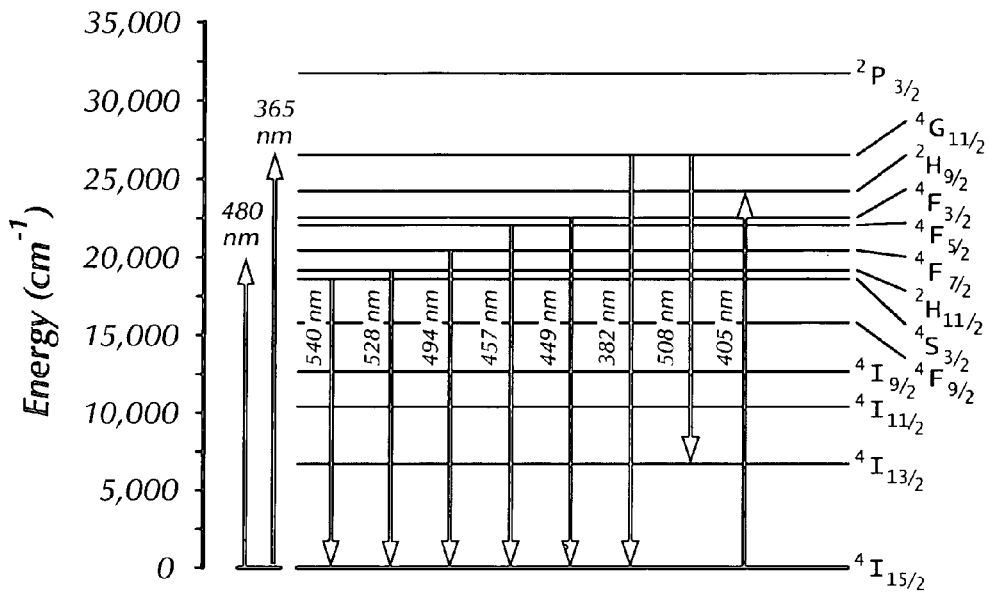
FIG. 10A is an energy level diagram that shows additional examples of pump and laser transitions for $Er^{3+}$.
FIG. 10B is a table that provides additional information regarding the transition diagram of FIG. 10A.

FIGS. 10A and 10B show additional examples of laser transitions for $Er^{3+}$ that can be utilized in a laser as described herein. Particularly, FIG. 10A is a diagram that shows the transitions, and FIG. 10B is a table that shows the initial state, the final state, the initial energy (in units of cm$^{-1}$), and final energy, the transition energy, the wavelength, and the oscillator strength for each transition.

Figures 11A, 11B:
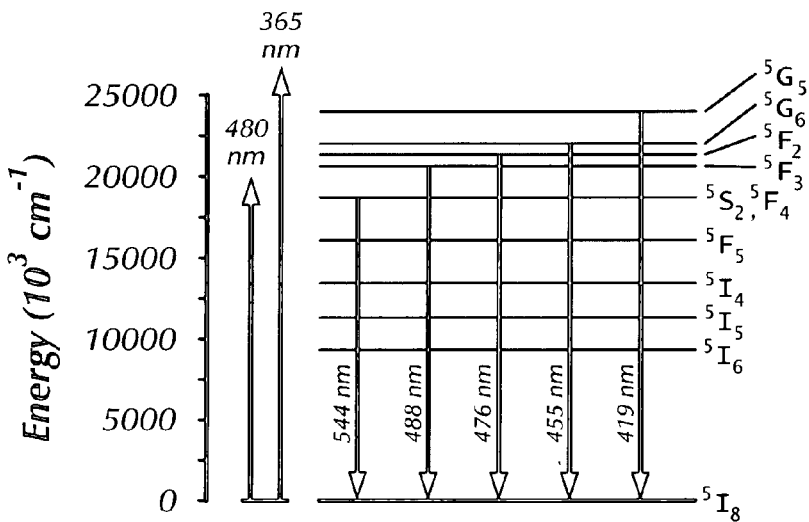
FIG. 11A is an energy level diagram that shows examples of pump and laser transitions for $Ho^{3+}$.
FIG. 11B is a table that provides additional information regarding the transition diagram of FIG. 11A.

FIGS. 11A and 11B show additional examples of laser transitions for Ho$^{3+}$ that can be utilized in a laser as described herein. Particularly, FIG. 11A is a diagram that shows the transitions, and FIG. 11B is a table that shows the initial state, the final state, the initial energy (in units of cm$^{-1}$), and final energy, the transition energy, the wavelength, and the oscillator strength for each transition.

Figures 12A, 12B:
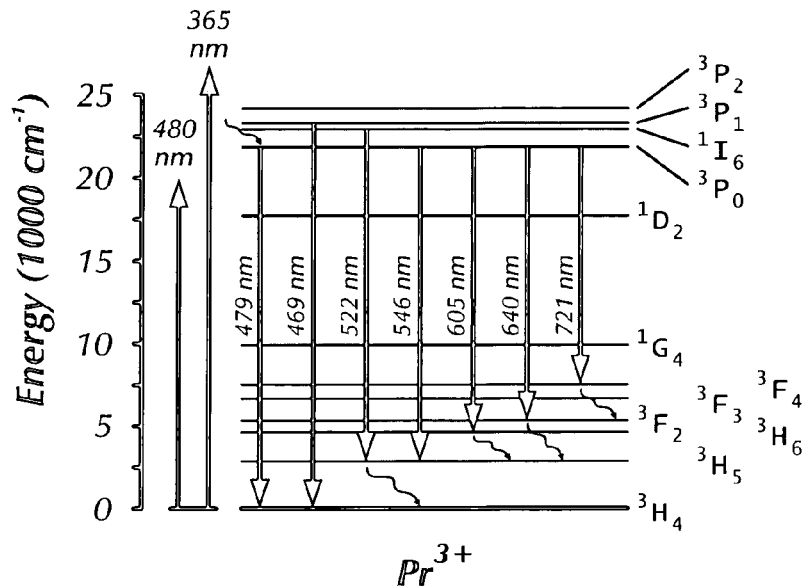
FIG. 12A is an energy level diagram that shows examples of pump and laser transitions for $Pr^{3+}$.
FIG. 12B is a table that provides additional information regarding the transition diagram of FIG. 12A.

FIGS. 12A and 12B show additional examples of laser transitions for Pr$^{3+}$ that can be utilized in a laser as described herein. Particularly, FIG. 12A is a diagram that shows the transitions, and FIG. 12B is a table that shows the initial state, the final state, the initial energy (in units of cm$^{-1}$), and final energy, the transition energy, the wavelength, and the oscillator strength for each transition.

FIGS. 13A and 13B show additional examples of laser transitions for Eu$^{3+}$:YVO$_4$ that can be utilized in a laser as described herein. Particularly, FIG. 13A is a table of the emission transitions, and FIG. 13B is a table of absorption transitions that show the initial state, the final state, the transition energy (in units of cm$^{-1}$), and the wavelength for each transition. It may be noted, as discussed above, that the resonant absorption from the $^7F_0$ (ground state) to the $^5D_3$ energy level that would correspond to ~408-nm diode laser radiation is not allowed by quantum rules. Although this is true for most materials, the result is different for Eu$^{3+}$:YVO$_4$. Particularly, it is believed that, in a Eu$^{3+}$:YVO$_4$ material system, host-sensitized energy transfer of violet/UV radiation leads to population in the $^5D$ levels. Therefore in context of the host YVO$_4$, the active ion Eu$^{3+}$ can be directly pumped by 408 nm laser diodes.

FIGS. 14A and 14B show additional examples of laser transitions for Tb$^{3+}$:TAB that can be utilized in a laser as described herein. Particularly, FIG. 14A is a table that shows the emission transitions, and FIG. 14B is a table of absorption transitions that shows the initial state, the final state, the transition energy (in units of cm$^{-1}$), and the wavelength for each transition.

By using the direct emission approach described herein, visible wavelength laser emission can be generated within a laser cavity without employing nonlinear crystal frequency conversion. By eliminating additional laser cavity elements such as the nonlinear crystal that would otherwise be required for frequency conversion, the size and cost of the laser device can be significantly reduced. Also, those skilled in the art will recognize that the noise (amplitude instabilities) typically encountered with the intracavity frequency doubling approach would be significantly reduced with the elimination of the nonlinear harmonic generator.

Co-doped Gain Media

In some embodiments, co-doping the host material with two or more rare-earth elements is a useful technique for generating visible laser radiation using short wavelength pump diodes. For example, active ions such as praseodymium (Pr$^{3+}$) and terbium (Tb$^{3+}$) have energy levels that could result in visible emission. However, these active ions may not have efficient absorption in the wavelength regime where high power blue/violet diode lasers are available. By co-doping the host material with one of these elements as well as another element (a codopant) that has strong absorption properties in the spectral region of interest, more efficient population of the upper laser level of the desired active element can be achieved.

For example, by co-doping the host material with both Tb$^{3+}$ and Dy$^{3+}$, the absorption of the Dy$^{3+}$ around 400 nm to efficiently absorb pump radiation. Then, via phonon decay, the Dy$^{3+}$ ion relaxes to a lower lying metastable energy level such as the $^4F_{9/2}$ level. Because of the proximity in energy level of the Tb$^{3+}$ $^5D_4$ energy level, there is a significant possibility of energy transfer from the Dy$^{3+}$ ion to the Tb$^{3+}$ ion, in which the Dy$^{3+}$ ion gives up its energy to promote a Tb$^{3+}$ ion to its excited $^5D_4$ energy level. Once this level becomes sufficiently populated, the Tb$^{3+}$ ion can then radiatively decay to produce emission in the visible range.

Another example is co-doping Pr$^{3+}$ with Dy$^{3+}$, again using Dy$^{3+}$ as the absorption sensitizer, ultimately resulting in energy transfer to the $^3P_0$ energy level of the Pr$^{3+}$ ion, again resulting in visible emission.

Also, thulium (Tm$^{3+}$) can be useful in a co-doped gain medium, because its $^1G_4$ energy level can emit visible wavelength radiation. Direct population of this level may be achieved by co-doping the host material with an absorption sensitizer such as Eu$^{3+}$ or Dy$^{3+}$, for example.

It will be appreciated by those skilled in the art, in view of these teachings, that alternative embodiments may be implemented without deviating from the spirit or scope of the invention. For example, the visible/UV laser emission from the gain medium may be further converted in frequency, such as by frequency doubling (SHG) processes, or frequency mixing, either intracavity or external cavity.

This invention is to be limited only by the following claims, which include all such embodiments and modifications when viewed in conjunction with the above specification and accompanying drawings. For purposes of convenience, in some of the following claims, the transitions are claimed in terms of the wavelength in nanometers (nm). In the specification, the particular transitions associated with the wavelengths are described.

What is claimed is:

1. A diode-pumped, solid-state laser that emits an output beam having a short wavelength, comprising:
    a laser cavity including a first and a second end mirror;
    a gain medium situated within said laser cavity, said gain medium including a rare-earth doped solid state material providing a lasing transition from an upper laser level to a lower laser level; and
    a laser diode pump source arranged to pump said gain medium, said laser diode pump source having a wavelength in the range of about 365 nm to 480 nm to excite said rare-earth element to an energy level at least equal to said upper laser level, thereby providing a laser emission from said lasing transition within said laser cavity in the range of 370 to 800 nm,
    wherein said rare-earth doped gain medium comprises an active ion comprising Sm$^{3+}$, and wherein said lasing transition is to a terminal level $^4G_{5/2}$ from said upper laser level which is selected from one of $^6H_{5/2}$, $^6H_{7/2}$, $^6H_{9/2}$, and $^6H_{11/2}$.

2. The laser of claim 1, wherein said upper laser level is $^6H_{5/2}$.

3. The laser of claim 1, wherein said upper laser level is $^6H_{7/2}$.

4. The laser of claim 1, wherein said upper laser level is $^6H_{9/2}$.

5. The laser of claim 1, wherein said upper laser level is $^6H_{11/2}$.

6. A diode-pumped, solid-state laser that emits an output beam having a short wavelength comprising:

a laser cavity including a first and a second end mirror;

a gain medium situated within said laser cavity, said gain medium including a rare-earth doped solid state material providing a lasing transition from an upper laser level to a lower laser level; and a laser diode pump source arranged to pump said gain medium, said laser diode pump source having a wavelength in the range of about 365 nm to 480 nm to excite said rare-earth element to an energy level at least equal to said upper laser level, thereby providing a laser emission from said lasing transition within said laser cavity in the range of 370 to 800 nm, wherein said rare-earth doped gain medium comprises an active ion comprising $Dy^{3+}$, and wherein said lasing transition has said upper laser level of $^4F_{9/2}$ and a terminal level which is one of $^6H_{11/2}$, $^6H_{13/2}$, and $6H_{15/2}$.

7. The laser of claim 6, wherein said terminal level is $^6H_{11/2}$.

8. The laser of claim 6, wherein said terminal level is $^6H_{13/2}$.

9. The laser of claim 6, wherein said terminal level is $^6H_{15/2}$.

10. A diode-pumped, solid-state laser that emits an output beam having a short wavelength, comprising:

a laser cavity including a first and a second end mirror;

a gain medium situated within said laser cavity, said gain medium including a rare-earth doped solid state material providing a lasing transition from an upper laser level to a lower laser level; and a laser diode pump source arranged to pump said gain medium, said laser diode pump source having a wavelength in the range of about 365 nm to 480 nm to excite said rare-earth element to an energy level at least equal to said upper laser level, thereby providing a laser emission from said lasing transition within said laser cavity in the range of 370 to 800 nm, wherein said rare-earth doped gain medium comprises an active ion comprising Tm3+, and wherein said lasing transition has said upper laser level of $^1G_4$ and a terminal level of $^3H_6$.

11. A diode-pumped, solid-state laser that emits an output beam having a short wavelength, comprising:

a laser cavity including a first and a second end mirror;

a gain medium situated within said laser cavity, said gain medium including a rare-earth doped solid state material providing a lasing transition from an upper laser level to a lower laser level; and a laser diode pump source arranged to pump said gain medium, said laser diode pump source having a wavelength in the range of about 365 nm to 480 nm to excite said rare-earth element to an energy level at least equal to said upper laser level, thereby providing a laser emission from said lasing transition within said laser cavity in the range of 370 to 800 nm, wherein said rare-earth doped gain medium comprises an active ion of $Ho^{3+}$, and wherein said lasing transition is one of 544 nm, 541 mm, 487 nm, 476 nm, 455 nm, and 419 nm.

12. The laser of claim 11, wherein said lasing transition is 544 nm.

13. The laser of claim 11, wherein said lasing transition is 541 mm.

14. The laser of claim 11, wherein said lasing transition is 487 nm.

15. The laser of claim 11, wherein said lasing transition is 476 nm.

16. The laser of claim 11, wherein said lasing transition is 455 nm.

17. The laser of claim 11, wherein said lasing transition is 419 nm.

* * * * *